United States Patent [19]

Mogab

[11] 4,211,601

[45] Jul. 8, 1980

[54] DEVICE FABRICATION BY PLASMA ETCHING

[75] Inventor: Cyril J. Mogab, Berkeley Heights, N.J.

[73] Assignee: Bell Telephone Laboratories, Incorporated, Murray Hill, N.J.

[21] Appl. No.: 929,569

[22] Filed: Jul. 31, 1978

[51] Int. Cl.² ................... H01L 21/306; C23F 1/02
[52] U.S. Cl. ................... 156/643; 156/646; 156/657; 156/662; 156/659.1; 204/164; 204/192 E; 252/79.1
[58] Field of Search ............ 156/643, 646, 657, 659, 156/662; 252/79.1; 204/164, 192 E, 298; 250/531

[56] References Cited

U.S. PATENT DOCUMENTS

| | | | |
|---|---|---|---|
| 3,880,684 | 4/1975 | Abe | 252/79.1 |
| 3,984,301 | 10/1976 | Matsuzaki et al. | 204/192 E |
| 4,069,096 | 1/1978 | Reinberg et al. | 156/643 |

*Primary Examiner*—William A. Powell
*Attorney, Agent, or Firm*—George S. Indig

[57] ABSTRACT

Integrated circuit fabrication, e.g., silicon LSI is expedited by plasma etching in any of a novel class of etchants. Appropriate plasma environments are produced by introduction of fluorocarbon-halogenation combinations as exemplified by $CF_3Cl$.

18 Claims, No Drawings

DEVICE FABRICATION BY PLASMA ETCHING

BACKGROUND OF THE INVENTION

A. Technical Field

Fine resolution device and circuits are fabricated by one or a series of steps each involving lithographic resolution followed by selective treatment of regions of device material. Lithography is ordinarily carried out in "actinic" material which is subsequently developed to result in aperture-delineation. Such patterns serve to directly or indirectly mask material undergoing processing. Selective etching may be carried out by dry processing for example, by means of a species produced in a plasma with such procedures being preferred to wet processing where particularly fine resolution is desired.

Such fabrication is used in production of Large Scale Integrated silicon circuitry. Use is contemplated for discrete devices; and in other semiconductor technology; for integrated optical circuitry, for magnetic memories, etc.

B. History

Large Scale Integrated Circuitry as well as other high resolution planar structures are generally fabricated through a series of levels. One procedure, common to construction of most such circuits involves: first producing a masking layer within a continuous region of actinic material by selective exposure to radiation; followed by development to selectively remove material—either radiated or unradiated. Such masking layers have served as or in the fabrication of discrete masks.

This mask technology now in prevalent use in the fabrication of silicon integrated circuits has undergone considerable development to the present point at which design rules of a few microns are regularly attainable. Discrete masks so used serve for secondary delineation of patterns in expendable photoresist layers which serve for actual device processing and which are removed to permit successive processing cycles of similar nature at each fabrication level.

It is generally believed that mask technology will be replaced by a maskless technology (direct processing) at such time that significantly finer resolution is required. In accordance with such comtemplated procedures, primary rather than secondary delineation will be in expendable resist layers tightly adherent to the device undergoing processing.

Regardless of procedures—whether mask or maskless; regardless of involved technology, a procedure common to all such fabrication involves selective etching of continuous layers of device-functional material. To date, wet etching—for example by use of aqueous acid media—has found satisfactory use. As resolution needs become more stringent inherent limitations become more significant. Liquid media reacting with polycrystalline or amorphous layers together result in isotropic etching. Resulting undercutting, to an extent approximately equal to the layer thickness, imposes a limit on spacing.

Increasing miniaturization has resulted in appreciation for advantages for dry processing. Etching by momentum transfer, for example by ion milling, minimizes contamination and imparts directionality to material removal. High accelerating fields with attained particle bombardment of surfaces being processed sometimes causes new problems. Lattice damage at some levels of fabrication may be significant. At the other end of the spectrum, dry processing may depend upon plasma assisted reactions. Plasma etching, for example, is dependent upon removal primarily due to chemical reaction of material to be removed with plasma-produced etching species. As in momentum transfer processes, —reaction product may be inherently removed—in this instance by system selection to result in vapor state product. Plasma assisted etching, however, in the extreme case is again essentially isotropic in behavior. Directionality, imposed for example in reactive ion etching or even by larger permitted energies in plasma etching, while tending toward anisotropic behavior may be undesirable in other respects. Lattice damage and resist erosion are among the problems encountered. As in wet etching, in precise end point detection as well as unequal wafer-to-wafer etching may result not only in extreme undercutting, but also in etching of underlying layers. The latter is alleviated by selection of systems with pronounced selectivity for material being etched.

A variety of materials are encountered in LSI production. They include the many varieties of elemental silicon (polycrystalline, single crystalline, doped, undoped) as well as a variety of silicon containing compounds (oxides as well as nitrides). As in many nonsilicon technologies, the prevalent plasma etchant is that resulting from introduction of mixtures of $CF_4$ and $O_2$. Etch rates are generally satisfactory for most materials. undercutting is a major disadvantage as applied to surfaces containing elemental silicon, in fact as applied to most materials to be etched etching behavior is essentially isotropic (lateral etch rate is approximately equal to etch rate in a direction normal to the plane of the surface). Generally good discrimination against a background of silicon compounds (about 10:1 over oxide or nitride) may permit some overetching but does not overcome the profile limitation of feature size/spacing.

SUMMARY OF THE INVENTION

Plasma etching processes particularly useful for etching of a variety of silicon containing surfaces are based on use of a class of etchants resulting from introduction to the plasma of a specified family of compositions. Such compositions which are considered precursors of (1) active atomic halogen etchant and (2) fluorocarbon derived species may be regarded as mixtures of such components. Certain of the materials of the class are compounds, necessarily containing an inflexible ratio of the two precursors, an example is $CF_3CL$. Precursor components may be associated in whole or in part with members of mixtures which therefore afford a flexibility in relative amounts. An example of $C_2F_6$-$Cl_2$. A variety of additional ingredients may be included for example to stabilize the plasma, to otherwise act as diluent, or serving as carrier.

Ethcing processes of the invention are characterized by good discrimination (generally 10:1 or better for silicon-rich material relative to most underlying material, e.g., $SiO_2$, $SiN_x$ as well as relative to organic resist).

A broad range of compositions as well as etch conditions result in improvement of etch profile as compared with prior art isotropic etching. Optimal composition and conditions result in regularly attainable ideal anisotropic behavior to result in absence of undercutting thereby permitting very close spacing—two microns and below.

DETAILED DESCRIPTION

1. General

The inventive subject matter is largely in terms of device or circuit fabrication. While not so limited, surface material studied has been within the category of primary interest of LSI fabrication. Material studied has contained elemental silicon-doped or undoped; polycrystalline or monocrystalline. Processes involving etching of true compounds such as covalently bonded $SiO_2$ and silicon nitride do not constitute preferred embodiments due primarily to poor selectivity relative to likely underlying elemental silicon-containing layers. Among suitably etched materials are silicides of for example molybdenum, tantalum and tungsten, which for these purposes are treated as alloys of compositions containing elemental silicon. Primary work indicates suitability of other elemental materials, e.g., germanium—in all the variations set forth for silicon.

Aspects of the invention are concerned with etch rates, discrimination, profile, loading effect, etc. Such considerations are in turn dependent upon composition as well as processing conditions and such considerations are treated in succeeding sections.

2. Terminology

Silicon-containing: This terminology refers to that category of surfaces of immediate concern for the practice of the invention. Such surfaces, commonly encountered in LSI, are those containing what may be regarded as elemental silicon. These surfaces may be single crystal or polycrystal. They may be doped to either conductivity type at any level of device significance. Silicon may be contained as part of an intermetallic compound such as a silicide of molybdenum, tungsten, or titanium (and such intermetallic compounds are to be distinguished from true chemical compounds such as covalently bonded $SiO_2$ which latter are not suitable for the inventive process).

Aluminum-rich: As the term connotes, these are materials which are at least 50 percent aluminum. Additionally, however, it is required that materials within this category showed the etching properties associated with elemental aluminum. Accordingly, whether containing unintended impurities or intended alloying materials, aluminum-rich materials as contemplated may form passivating surfaces upon exposure to atmospheres commonly encountered and should otherwise show general etching behavior characteristic of the elemental material. Certain alloying ingredients such as silicon and copper, both commonly included in LSI fabrication, are likely to be present in small amounts—of the order of a few percent. Other ingredients which are, themselves, similar to aluminum, may be contained in larger amounts with the resulting composition still benefiting by use of the inventive procedures.

3. Etchant Precursor Composition

Composition is discussed in terms of a mixture of $C_2F_6$ and $Cl_2$. The principle of operation, however, is sufficiently generic to include a number of alternatives. So, for example, chloride or chlorine may be replaced by other halogens and other halocarbons may be used.

Materials introduced into the plasma are such as to yield an active etchant species and, in addition, a second species which may combine with the active etchant species in the bulk of the plasma so as to significantly reduce or eliminate etching activity. The second species, denoted recombinant, is, in preferred instances, chemically distinct from the active etchant species. In such preferred embodiments, recombinant is a species derived from a fluorocarbon. Appropriate precursor composition may consist of a single compound, such as $CF_3Cl$ or $CF_3Br$, or it may consist of a mixture containing diatomic halogen together with a fluorocarbon. Experimental results indicate similarity of plasma derived species produced by the single compound $CF_3Cl$ and the 50:50 volume percent mixture of $C_2F_6$ and $Cl_2$. Accordingly, equivalent plasma derived species may result from three, two, or even one component systems (i.e., $C_2F_6$—$CF_3Cl$—$Cl_2$; $C_2F_6$—$Cl_2$; $CF_3Cl$—$Cl_2$; $CF_3Cl$—$C_2F_6$; $CF_3Cl$).

Precursor composition is the primary determinant of etch profile. Etchants of the type described are relatively insensitive to variations in plasma power and pressure so that the latter may be chosen with a view to process flexibility. Adjustment of power and pressure may be such as to result in desired etch rate, to maintain uniform confined plasmas, to avoid irradiation damage (attributed to X-ray liberated from irradiated surface).

Ideal anisotropically etched vertical walls result from composition centering about 10 volume percent equivalent Cl relative to total Cl plus equivalent $CF_3$. Increasing amounts of chlorine tend to increase etch rate and also the increase selectivity for surfaces to be etched relative to many underlying materials—e.g., silicon oxide, silicon nitride. A minimal amount of fluorine-containing compound is useful in etching any surface oxide. For this reason, the equivalent volume percent of Cl is fixed at a maximum of about 99 percent. Lessening equivalent Cl results in reduction of etch rate. For many purposes, a minimum equivalent Cl content is about 5 volume percent based largely on etch rate.

Bromide and/or bromine may be substituted for chloride/chlorine. Relative amounts of equivalent precursor components are as discussed. Homologs of $C_2F_6$—i.e., $C_3F_8$ may be utilized. However, significant content and, to a greater extent, of still higher homologs may result in polymer deposition which may impede etching.

A variety of additional ingredients may suitably be included. Such ingredients may serve as diluent, carrier, etc. Helium is usefully included, particularly where bromine or a bromide forms a significant part of the composition. It is found that resulting plasmas are "polarizable", tending to result in nonuniformity. Helium, included in amounts of up to about 30%, effects a redistribution of electrons resulting in more uniform plasma. Higher helium content is equally effective but reduced etch rate results.

A precursor, generally nonpreferred, but which retains some of the advantages of the etchant systems of the invention, consists simply of diatomic halogen ($Cl_2$ or $Br_2$) with or without diluent. Such mixtures, with argon serving as diluent, are found similar in some respects to equivalent mixtures containing $CF_3$ precursor in equivalent amount. Likely presence of surface oxide is a complication for such a single component etchant. Such oxide, not attacked by atomic halogen, may be removed by initial or continuing introduction of a fluorine-containing component (e.g., $C_2F_6$).

4. Etchant Composition

It is concluded on the basis of a variety of experimental approaches that the primary etchant species is atomic halogen—e.g., atomic chlorine. While $CF_3$ or plasma derived species thereof may, itself, be a secondary etchant, it functions primarily as recombinant (as well as to initially etch any surface oxide). Spectroscopic study reveals CF$_3$Cl end product for C$_2$F$_6$—Cl$_2$ precursor.

A desirable attribute of any of the disclosed etchants is high selectivity, both with respect to likely underlying materials and with respect to resist. An additional attribute, more fully disclosed in copending application, Ser. No. 929,568, filed July 31, 1978 (C. J. Mogab Case 4), is relative independence of etch rate on surface area undergoing etching. Elimination of this "loading effect" is also common to all of the inventive compositions.

Profile control—particularly attainment of ideal anisotropic vertical walls—is possible through use of preferred compositions. General requirements for anisotropic etching are set forth in copending application, Ser. No. 929,549, filed on July 31, 1978 (Harashbarger-Levinstein-Mogab-Porter Case 2-23-6-5). Briefly, profile control depends upon surface chemistry with requirements being met by presence of hydrocarbon based polymeric material—e.g., any organic resist otherwise suitable, together with power and pressure levels such as to bring about the desired balance between surface recombination and etching. Profile control is accomplishable by use of a mixture desirably of two chemically distinct species-the one serving as primary effective etchant; the second, as recombinant. Fluorocarbons described above are found to recombine with etchant species in the immediate vicinity of resist edge—etch walls to lessen etching (and thereby lessen undercutting).

Preferred species serving to premit attainment of profile control generally require greater proportional amounts of fluorocarbon than contained in CF$_3$Cl.

5. Material to be Etched

While a variety of compositions are suitably processed, most of immediate concern contain silicon. Silicon-containing material, as described under Terminology, include many of those useful in LSI and other types of integrated circuitry. A variety of other elemental materials, as well as variations analogous to those based on silicon may be processed.

6. Processing Conditions

As indicated, processing conditions are, to a large extent, tailored with a view to practical considerations, such as etch rate, plasma uniformity, etc. Suitable rates for most contemplated layer thicknesses are realized within the power limits of from 0.05 watt/cm$^3$ to 1 watt/cm$^3$ and within the pressure limits of from 0.01 to 1.0 torr.

It is interesting to note that compositions yielding ideal anisotropic walls at given power-pressure may be caused to approach isotropy by decreasing power/pressure. While not a particularly significant effect in these systems, the observed trend is in marked contrast to that of general prior art understanding in accordance with which anisotropy is thought favored by the directionality imposed by larger field-imposed velocity.

It is convenient for expository purposes to briefly describe plasma etching conditions as normally encountered in reactor designs in present use. For a variety of reasons, parallel plate reactors are gaining in favor in the industry. Advanced designs assure flow patterns resulting in reasonable wafer-to-wafer etching uniformity. See for example A. R. Reinberg in "Etching for Pattern Definition" (H. G. Hughes and M. J. Rand, eds.), The Electrochemical Society, Inc. Princeton, N.J., 1976; and R. G. Poulsen, *J. Vac. Sci. Technol.*, 14, 266, (1977).

Parallel plate systems comprise pairs of plates contained in a suitable vacuum enclosure. Power, commonly in the rf range (e.g., 13.56 megahertz), is applied to the driven plate to initiate and sustain a discharge between the plates, the nondriven of which is ordinarily held at ground potential. It has been indicated that "plasma etching" as here contemplated may include a variety of procedures commonly designated otherwise. The only requirement for these purposes is primary removal of surface material to be etched through chemical reaction rather than momentum exchange with plasma derived active etchant species. Nomenclature variations may arise, for example, in accordance with relative size of electrodes, as well as, placement of the wafers (either on the driven or nondriven electrode/s). In the procedure commonly known as reactive ion etching, the driven electrode is substantially smaller than the counter electrode and the material to be etched is placed on the driven electrode. In the case of the procedure ordinarily referred to as plasma etching the electrodes are more nearly symmetric and the material to be etched is placed on the nondriven electrode. Such apparatus variations, as well as variation among the conditions: power, pressure, etc. qualify in accordance with the teaching provided the fundamental requirement (primary removal by chemical reaction . . . ) is met.

Parameters subject to control in these reactors are: Etch gas composition, pressure, inlet flow rate, power, interelectrode spacing and substrate temperature. Typical ranges for these parameters are: pressure—10$^{-3}$—2.0 Torr; flow rate—10–500 SCCM; power—10–0–3000 watts; electrode diameter-17-inches; electrode spacing—5—50 millimeters; substrate temperature—25—250 degrees C.

Desired plasma etching conditions considered to represent preferred usage are discussed. Discussion is generally in terms of apparatus available at this time. It is quite likely that improved apparatus design will have its expected effect. Accordingly, the following discussion, while meaningful in terms of present practice, may not be limiting particularly in accordance with future practice.

In reactor designs, it is significant that inventive processes may provide for desired profiles at plasma pressures of the order of 0.01 torr. This is in contradistinction to many prior art processes in which ideal anisotropic etching was accomplished only at lower pressure. This pressure value is the approximate demarcation between viscous flow (for higher pressures and nonviscous atomic, ionic or molecular flow at lower pressures). Viscous flow designates the condition under which collision is more likely within the plasma than between the plasma and a solid surface. It accordingly designates, for typical plasma power density, the threshold condition, below which substantial radiation damage may result.

Plasma powers of several watts per cubic centimeter are available. Powers substantially above 1 watt/cm$^3$ cause nonuniformity problems and plasma stability is difficult to maintain at pressures of the order of 1.0 torr and above.

A third parameter, inter-related with the first two, is etch rate. From a commercial standpoint, this is a significant factor sometimes determinative of throughput. It is significant, too, in that slower etching necessarily implies longer periods of resist exposure. Depending upon the thickness of the layer to be etched, resist erosion, normally at a significant level, may become limiting. For many lithographic processes, practical resist thicknesses do not greatly exceed mean dimensions to be defined. It is reasonable to set a minimum value on etch rate at 300 Angstrom units/min. or preferably at 500 Angstrom units/min. Etchant discrimination as between usual materials to be etched and the more durable of the polymeric resists, is generally sufficient to permit retention of an effective fraction of resist for such rates. For relatively thick layers to be etched—layers on the order of microns—the above considerations give rise to a preference for etch rates substantially above 500 Angstrom units/min.

7. Examples

The following example was conducted in a radial flow reactor of the type described in the preceding section under Processing Conditions.

EXAMPLE 1.

400 watts, 0.35 torr, 30mm electrode spacing, 25 degrees C. nondriven lower electrode temperature, 175 sccm reactant flow rate of a mixture of 15 volume percent $Cl_2$-85 volume percent $C_2F_6$. An etch rate of 950 Angstroms/min. was realized in phosphorous doped polysilicon.

EXAMPLE 2.

The conditions of Example 1 were utilized, however, with a 90 volume percent of $CL_2$-10 volume percent $C_2F_6$ reactant mixture to result in an etch rate of 3440 Angstroms/min.

EXAMPLES 3, THROUGH 8

These examples were all conducted under the conditions noted in Examples 1 and 2. They are presented in tabular form. Reactant in each instance was a two-part mixture of $Cl_2$ and $C_2F_6$.

| Example | Volume Percent $Cl_2$ | Etch Rate (A per min.) |
|---|---|---|
| 3 | 25.9 | 1700 |
| 4 | 19.4 | 1240 |
| 5 | 13.8 | 800 |
| 6 | 12.0 | 760 |
| 7 | 10.0 | 600 |
| 8 | 7.5 | 530 |

EXAMPLE 9

Undoped single crystalline silicon was etched in a $CF_3BR$—30 volume percent He·reactant mixture with a power of 500 watts and otherwise under the conditions set forth in Example 1. Etch rate was 606 Angstroms/min.

EXAMPLE 10

Single crystal silicon was etched in $CF_3Cl$ at a power of 200 watts a flow rate of 200 sccm and otherwise under the conditions of Example 1. Etch rate was 193 Angstroms/min.

I claim:

1. Process for fabrication of an article comprising at least one operation during which the article undergoing fabrication comprises a surface of material to be etched, wherein the said article is etched within a plasma environment contained within an apparatus, the plasma resulting from imposition of an electrical field across gaseous reactant between two electrodes, the material to be etched comprising a silicon-containing composition, etching being primarily due to chemical reaction with the said material to be etched, CHARACTERIZED IN THAT the said gaseous reactant comprises the equivalent of a mixture of at least one halide and a halogen which in the said plasma results in the said chemical reaction in which the said halide is a fluorocarbon and in which the said gaseous reactant has an equivalent fluorocarbon/atomic halogen ratio greater than that contained in $CF_3Cl$.

2. Process of claim 1 in which the said halogen is selected from the group consisting of $Cl_2$ and $Br_2$.

3. Process of claim 1 in which the said fluorocarbon is selected from the group consisting of chlorofluorocarbon and bromofluorocarbon.

4. Process of claim 3 in which the said gaseous reactant consists essentially of the said fluorocarbon.

5. Process of claim 4 in which the said gaseous reactant contains $CF_3Cl$.

6. Process of claim 4 in which the said gaseous reactant contains $CF_3Br$.

7. Process of claim 6 in which the said gaseous reactant includes helium.

8. Process of claim 1 in which the said gaseous reactant contains two chemically distinct species at least the first of which is a halide, at least the second of which is a halogen.

9. Process of claim 1 in which the said fluorocarbon consists essentially of $C_2F_6$.

10. Process of claim 9 in which the said halogen consists essentially of $Cl_2$.

11. Process of any of claims, 1, 2, 3, 4, 5, 6, 7, 8, 9 or 10 in which the said material to be etched consists primarily of elemental silicon.

12. Process of claim 11 in which the said material contains at least one silicide.

13. Process of claim 11 in which the said material to be etched comprises polycrystalline silicon.

14. Process of claim 13 in which the said polycrystalline silicon is doped with an extrinsic impurity.

15. Process of claim 11 in which the said elemental silicon is single crystal.

16. Process of claim 1 in which etching is limited to selected regions of the said surface.

17. Process of claim 16 in which the said selected regions correspond with regions bared through apertures of an overlying masking layer.

18. Process of claim 17 in which the said masking layer consists essentially of an organic resist masking layer.

* * * * *